United States Patent [19]
Gillis et al.

[11] 4,111,519
[45] Sep. 5, 1978

[54] RECORDING AND READING SYNTHETIC HOLOGRAMS

[75] Inventors: Alva Knox Gillis, Melbourne; Thomas Harvey Otten; Andrew Miklos Bardos, both of Indian Harbour Beach, all of Fla.

[73] Assignee: Harris Corporation, Cleveland, Ohio

[21] Appl. No.: 665,720

[22] Filed: Mar. 10, 1976

[51] Int. Cl.² ............................................. G02B 27/00
[52] U.S. Cl. ........................... 350/3.66; 350/162 SF; 350/314; 365/125
[58] Field of Search .......... 346/108; 350/3.5, 162 SF, 350/314; 307/207, 268, 295; 340/173 LM

[56] References Cited
U.S. PATENT DOCUMENTS

| | | | |
|---|---|---|---|
| 3,652,144 | 3/1972 | Vander Lugt | 350/3.5 |
| 3,727,062 | 4/1973 | Foster | 346/108 UX |
| 3,787,887 | 1/1974 | Burton | 346/108 |
| 3,787,888 | 1/1974 | Haskal | 346/108 |
| 3,812,496 | 5/1974 | Brooks | 346/108 |
| 3,943,019 | 3/1976 | Krekeler et al. | 350/314 X |

OTHER PUBLICATIONS

A. Kozma, "One-Dimensional Holograms for Storing Digital Data", Mtg. of Opt. Storage of Dig. Data, 19-21 Mar. 1973, Aspen, Colorado.

Primary Examiner—John K. Corbin
Assistant Examiner—John D. Lee

[57] ABSTRACT

A byte of binary data to be stored is recorded as a synthetic Fourier transform hologram of the byte of data. A time varying control signal representing the synthetic hologram is used to intensity modulate a coherent light beam as the beam scans transversely across a photosensitive recording film. The amplitudes of different spatial frequencies in the data band are differently altered to compensate for signal to noise roll-off over the data band. The thus compensated signals are also modified to compensate for nonlinear gain characteristics. The thus modified signals are processed to provide the modulating control signal. During the readout process an inverse Fourier transformation is performed optically on the light diffracted by the synthetic hologram in order to produce the original byte of data in the form of an optical intensity pattern. This pattern is transversely distributed on an array of photosensitive detectors which converts the optical intensity pattern to an electrical data signal. During this readout process a tapered neutral density filter, i.e. a wedge filter, is employed in front of the photosensitive detectors to provide attenuation or gain across the spatial frequency bandwidth to compensate for system modulation transfer function.

18 Claims, 13 Drawing Figures

RECORDING AND READING SYNTHETIC HOLOGRAMS

This invention relates to the art of digital data storage and more particularly to a system of recording and reading a synthetic Fourier transform hologram of a byte of digital data.

The advantages of recording digital data through the use of Fourier transform holograms is well known. Since the data is distributed over a relatively large area, significant reduction in the sensitivity of recording to dust and other amplitude imperfections is achieved. In addition, the reconstructed data is spatially invariant under translation of the hologram which eases mechanical tolerances during the readout process. A Fourier transform hologram may be generated synthetically or interferometrically.

In interferometric holography a spatially modulated beam of coherent light, called the signal beam, is mixed at the film surface with an unmodulated beam of light, called the reference beam. The interference pattern thus generated on the film surface is a hologram. Synthetic holography differs in that only a single beam of intensity modulated light is scanned across the film to create the hologram. The modulation is controlled electronically so that the proper pattern is exposed on the film surface.

Synthetic holography has an inherently simple optical system and is quite versatile since scanning and modulating are electronically controllable. It does, however, require the use of an electronic Fourier transform generator having sufficient bandwidth to expose the hologram sequentially i.e. the synthetic recorder is a serial bit stream system.

One problem noted in synthetic hologram systems is that the signal to noise ratio varies as a function of spatial frequency over the data band. For example, if a digital Fourier transform generator is employed a certain amount of amplitude roll off results because a finite pulse width is used to represent the amplitude values of the hologram being recorded. Also, the noise, due mainly to film grain noise, rolls off as a function of spatial frequency but not at the same roll off rate as the signal amplitude.

Another problem noted in synthetic hologram systems deals with the intermodulation noise resulting from amplitude nonlinearities in the beam modulator and in the transmittance versus exposure characteristics of the film. Under ideal conditions the transmittance of a hologram is linearly proportional to the Fourier transform data to be recorded. However, because of modulator and film nonlinearities, a nonlinear function of the desired transform is actually recorded. These nonlinearities can generate frequencies not present in the input and can modify the relative amplitudes of the frequencies present in the input.

SUMMARY OF THE INVENTION

It is therefore a primary object of the present invention to provide improved noise compensation in a synthetic hologram recording-reading system.

It is a more specific object of the present invention to provide compensation in such a system to produce approximately constant signal to noise ratio across the reconstruction data bandwidth.

It is a still further object of the present invention to provide a digital filter in conjunction with a digital transform generator in such a system and wherein the digital filter shapes the frequency distribution of the hologram function to achieve uniform signal to noise ratio upon readout.

It is a still further object of the present invention to employ such a digital filter as discussed immediately above for distributing energy on a uniform signal to noise basis before recording the hologram as well as for reversing this process by making the bit intensity uniform with an optical wedge filter before the readout light strikes a readout photosensitive detector system.

It is a still further object of the present invention to employ such a digital filter in a synthetic hologram recording and readout system for purposes of compensating for the system transfer function (MTF) which is a product of various subsystem transfer functions.

It is a still further object of the present invention to provide a synthetic hologram recording and readout system including an amplitude equalizer that weights the hologram function signal nonlinearly so as to compensate for system nonlinearities of amplitude that arise in the recording process and in the recording film amplitude responsive characteristics to eliminate intermodulation noise and to permit more than one type of film to be employed for holographic recording.

The present invention contemplates that a transform hologram of a byte of binary data be recorded as an intensity modulated pattern of coherent light on a photosensitive recording medium. The hologram is recorded as a beam of coherent light is scanned transversely of its direction of propagation across the recording medium. A time varying control signal representing the synthetic hologram function is employed for amplitude modulating the light beam as it is scanned across the recording medium. The control signal is preferably obtained by providing a Fourier series transform of the byte of data so as to thereby providing a signal which contains information representative of the summation of a plurality of frequencies with each frequency being representative of the presence of a bit at a particular bit position in the byte of binary data.

In accordance with the present invention the output information containing signal is utilized for purposes of providing the modulating control signal such that the modulating control signal is compensated for system and or subsystem characteristics.

In accordance with another aspect of the present invention the compensation includes nonlinear amplitude equalization on the modulating control signal to compensate for amplitude nonlinearities in the recording process and in the film amplitude response characteristics.

In accordance with a still further aspect of the present invention both digital and analog filtering serve to tailor the modulating control signal during a recording of a synthetic hologram such that the frequencies comprising the synthetic hologram are exposed onto the film with different energies in order to weight the frequencies of compensate for the system modulation transfer function as well as to compensate for noise roll-off within the system data band to thereby achieve a substantially constant signal to noise ratio in the reconstructed data image upon readout.

In accordance with a still further aspect of the present invention spatial optical filtering, such as that achieved with a wedge filter, is employed during the readout process for amplitude compensation of the reconstructed data band so that equal energy signals are incident upon each element of a readout photosensitive detector array.

DESCRIPTION OF THE DRAWINGS

The foregoing and other objects and advantages of the invention will become more readily apparent from the following description of the preferred embodiments of the invention as taken in conjunction with the accompanying drawings which are a part hereof and wherein.

DESCRIPTION OF THE PREFERRED EMBODIMENTS

General Description

Reference is now made to the drawings wherein the showings are for the purposes of illustrating preferred embodiments of the invention only and not for purposes of limiting same. A synthetic hologram recording system is illustrated in FIG. 1 and a companion synthetic hologram readout system is disclosed in FIG. 2.

Figure 1:
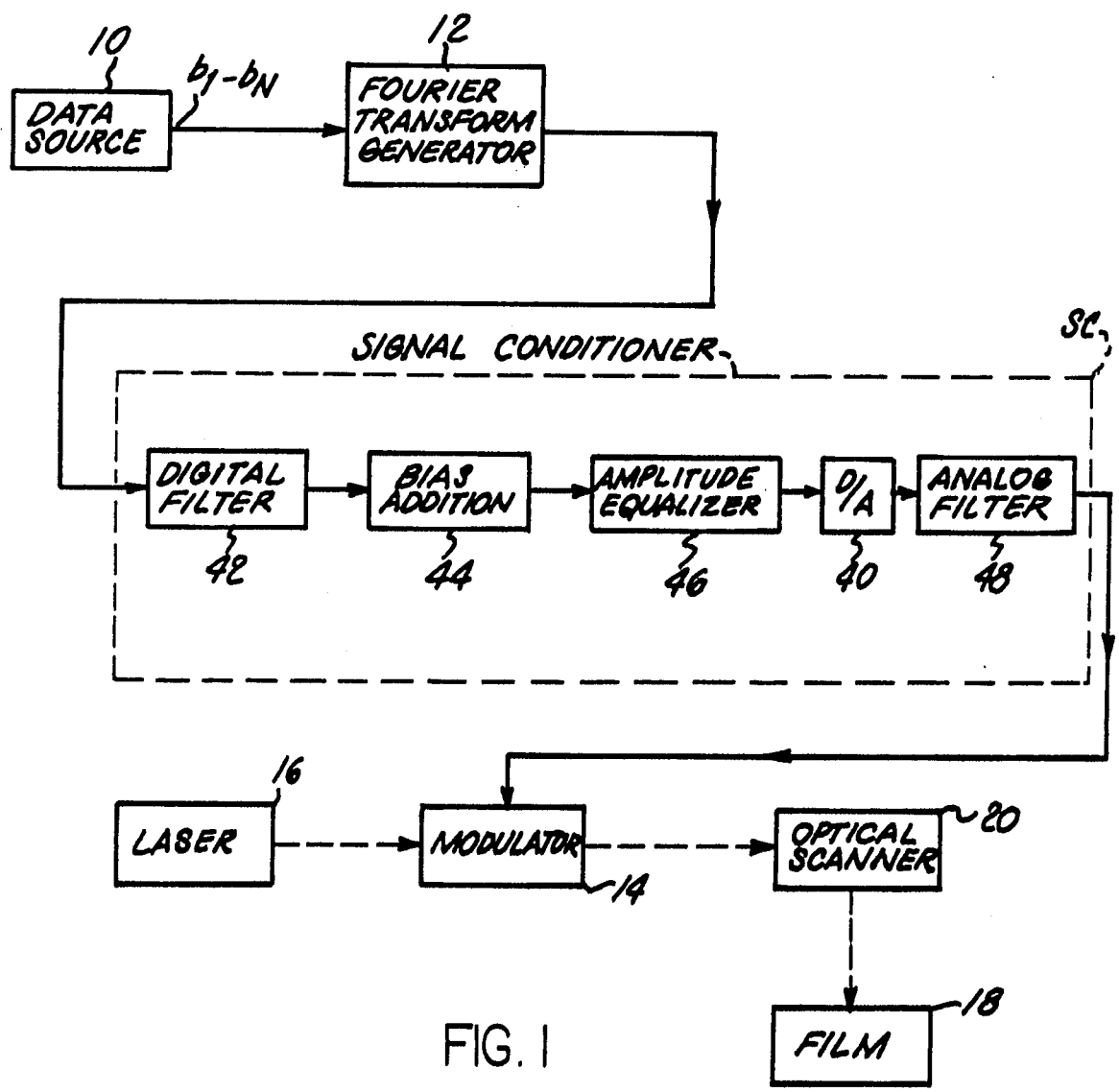
FIG. 1 is a block diagram illustration of a synthetic hologram recording system embodying the present system.

Referring now to FIG. 1, there is illustrated a synthetic hologram recording system wherein a byte of binary data is supplied by a suitable data source 10 to a Fourier transform generator 12 which provides a transform of the byte of digital data and this transform, which takes the form of digital samples or coefficients of a discrete Fourier series transform, is supplied to a signal conditioning circuit SC, constructed in accordance with the present invention, and which in turn supplies a time varying modulating signal, representative of the Fourier series transform, to a modulator 14. The modulator 14 responds to the control signal provided by the signal conditioner circuit SC to intensity modulate a beam of coherent light obtained from a laser source 16 as the beam is scanned across a photosensitive recording film 18 by means of a suitable optical scanner such as an acousto-optic scanner or a mechanical scanner such as scanner 20. Thus, a synthetic hologram of the byte of binary data is recorded on film 18 as opposed to the data itself.

Figure 2:
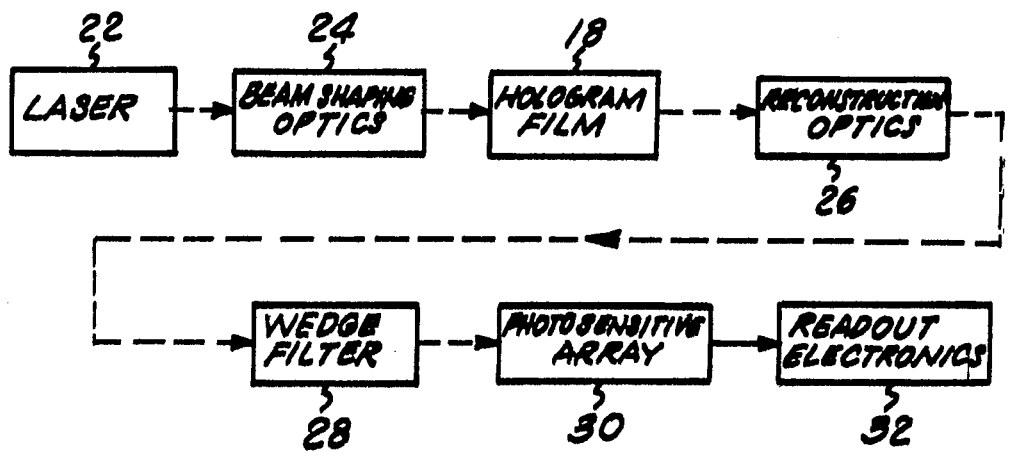
FIG. 2 is a block diagram illustration of a readout system for reconstructing the information contained in a synthetic hologram in accordance with the present invention.

Reference is now made to FIG. 2 which illustrates apparatus for readout and reconstruction of the data recorded as a Fourier transform hologram on film 18. Readout is accomplished by relatively conventional means in that a source of coherent light obtained from a laser source 22, as shaped by suitable beam shaping optics 24, impinges on film 18. An inverse Fourier transformation is performed optically on the light diffracted by the synthetic hologram by means of conventional reconstruction optics 26. In accordance with the present invention spatial optical filtering, as by a wedge filter 28, is employed during the readout to provide amplitude compensation of the reconstructed data band so that equal energy signals are incident upon each element of a photosensitive detecor array 30. The electrical output from the photosensitive array 30 is employed to energize suitable readout electronics 32.

In the system described thus far it is known in the art to record a Fourier transform of a byte of binary data as a synthetic hologram employing components corresponding with data source 10, the Fourier transform generator 12, some means to provide the time varying analog digital signal, such as a digital to analog converter 40 (included in the signal conditioner SC of FIG. 1) and recording equipment such as the modulator 14, the laser source 16, the film 18 and the optical scanner 20. Also, the readout components illustrated in FIG. 2 but for the provision of wedge filter 28, are known in the art for reconstructing a synthetic hologram.

In accordance with the present invention the recording system illustrated in FIG. 1 employs a signal conditioning circuit SC which includes components which serve to compensate for roll-off in the signal to noise ratio as a function of spatial frequency and components to compensate for nonlinear amplitude variations.

The signal conditioner SC processes the discrete Fourier transform sample values obtained from the Fourier transform generation 12 and converts them to an analog signal that is suitable to intensity modulate a laser beam. In the embodiment shown in FIG. 1 the signal conditioner employs a discrete digital filter 42, a bias adder 44, an amplitude equalizer 46, the digital to analog converter 40, and an analog filter 48.

As will be described in greater detail hereinafter, the digital filter 42 serves to receive sample coefficients of the Fourier transform function from the Fourier transformer generator 12 and shapes the frequency distribution of the hologram function to achieve a uniform signal to noise ratio upon readout at various spatial frequencies which comprise the hologram function. The signal energy is thus distributed on a uniform signal to noise basis before recording and, as will be described hereinafter with reference to FIG. 2, the process is later reversed during readout by making the bit intensity uniform with an optical wedge filter 28 before the light strikes the readout photosensitive detectors 30. The digital filter also tends to compensate for the system transfer function which is a product of various subsystem transfer functions including the following: the transfer function of the signal conditioner SC, the transfer function of the laser modulator 14; the spot intensity of the recording beam; and the film modulation transfer function.

Figure 3:
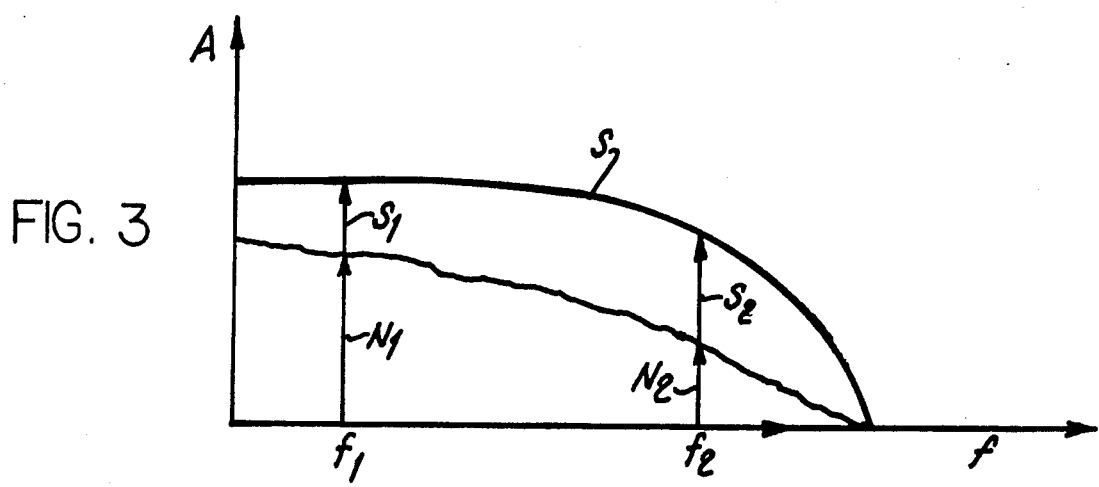
FIG. 3 is a graphical illustration showing signal to noise ratio roll-off with spatial frequency.

FIG. 3 is a graphical illustration showing the modulation transfer function of a system which does not employ correction, such as digital filter 42, and from this graphical configuration it is seen that both the signal S and the noise N roll-off as a function of spatial frequency. However, the amplitude of the noise rolls off at a faster rate than that of the signal, and, hence, the signal to noise ratio SNR varies with increasing spatial frequency. For example, at frequency $F_1$ the ratio of the signal $S_1$ to noise $N_1$ is substantially less than at a much high frequency $F_2$ where the ratio is $S_2$ to $N_2$. The digital filter 42 serves to tailor or weight the digital samples or coefficients obtained from the Fourier transform generator over the frequency band so that the output information exhibits a substantially constant signal to noise ratio SNR over the data band or spatial frequency band employed.

The bias addition circuit 44 may take a form well known in the art and serves to provide a fixed bias to the digital output signals obtained from the digital filter 42. This is done in the embodiment illustrated because it is contemplated that the Fourier transform generator 12 may provide output coefficients which have both positive and negative values. Consequently then, to prevent the beam modulating function from becoming negative at any time, the output of the digital filter 42 is offset by a fixed bias signal by means of the bias addition circuit 44. During readout the inverse transform of the bias signal is a DC term that contaminates a region near the origin of the data function. The DC bias level added to the modulating signal for film biasing purposes in independent of the particular values of the data being recorded because the DC level of the data is made very small by the addition of random phase terms in the transform generator.

The amplitude equalizer 46, to be described in greater detail hereinafter, serves to weight the hologram function nonlinearly so as to compensate for system nonlinearities of amplitude that arise in the recording process and in the film amplitude response characteristics. Different types of film used for recording the holograms have different nonlinear exposure characteristics.

Figure 4:
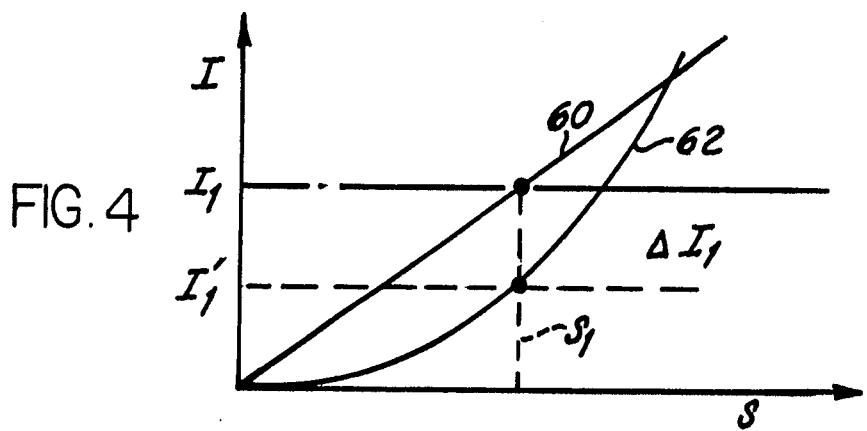
FIG. 4 is a graphical illustration showing amplitude nonlinear response characteristics.

With respect to the amplitude equalizer, reference is now made to the graphical illustration of FIG. 4 illustrating the intensity of the information recorded on the film as a function of the sample being recorded. The desired response characteristic is a linear curve 60. However, the actual response characteristic is represented by the nonlinear curve 62. Consequently then, for a given sample $S_1$, the level of intensity recorded is indicated by $I'_1$ and not the desired level $I_1$. A correction of $\Delta I_1$ is required to obtain the correct intensity recording. As will be explained in greater detail hereinafter the amplitude equalizer provides a correction for each sample recorded so that with respect to the example of FIG. 4 the intensity recorded will be that corresponding to level $I_1$ and not to level $I'_1$. It is in this manner that the amplitude equalizer weights the hologram function nonlinearly to compensate for system nonlinearities of amplitude.

The corrected sample values from the amplitude equalizer 46 are converted to a time varying analog signal by means of a conventional digital to analog converter 40. These signals are then filtered by an analog filter 48 so as to pass the data band itself but cut off higher frequencies. In the event both a real data band and a data band image are provided, this will serve to cut off the data band image and other higher order blocking images which might exist at frequencies above the desired data band.

Figure 5:
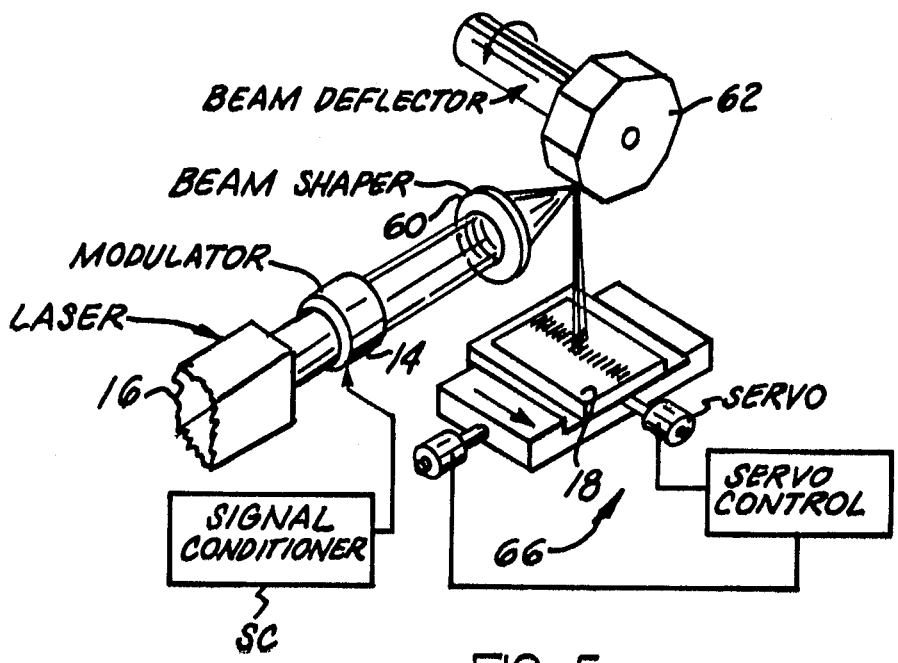
FIG. 5 is a perspective illustration of the optical recording apparatus employed in one embodiment of the invention.

The time varying analog signal provided by the signal conditioner circuit SC drives a modulator 14. Reference should now be made to both FIGS. 1 and 5 for the optical recording equipment. A laser beam from laser source 16 enters modulator 14 and is intensity modulated as a function of time by the time varying control signal supplied by the signal conditioner SC. Modulator 14 is conventional and may take the form of either an electro-optical transducer or an acousto-optical type modulator. The output of the modulator 14 is a spatially stationary beam of coherent light that is intensity modulated as a function of time and wherein equal successive increments of time represent successive sample values of the hologram function.

The intensity modulated beam from the modulator 14 is shaped in transverse directions by beam expander lens 60 which is conventional in the art. After expansion, the intensity modulated signal beam continues after a light path to a scanner 62 from which the beam is reflected in time varying directions in order to distribute the hologram function through space. The scanner is conventional and its function is to scan the time intensity modulated signal beam across the recording film 18 in one sweep during the time that the analog signal driving the modulator 14 changes through one hologram function. This scanning action converts a time function of beam intensity to a spatial distribution of beam intensity, transversely distributed with respect to the direction of propagation of the light.

After deflection by the scanner 62, the signal beam is directed onto a transverse plane at which the photographic film 18 is located. A film transport unit 66, which includes a servo control mechanism, moves the film transversely in the film plane, in a direction perpendicular to the transverse direction in which the beam scans.

Each hologram corresponds to one optical scan by the scanner 62 and successive holograms are recorded by moving the film by means of the film transport unit 66. Preferably, the film is moved continuously (rather than in steps) while successive holograms are being recorded by successive optical scans perpendicular to the direction of film travel.

The intensity of light impinging on the film is controlled by one of the hologram function samples. The angular position of the scanner 62 is synchronized with the start of the hologram function that modulates the light beam so that the sample values start at one end of an optical scan.

The data in each hologram is contained in a spatial frequency side band.

Each bit of the data of the original data block produces a unique spatial frequency on the film. Thus each bit of original data is represented on the film by the presence or absence of a particular spatial frequency. The spatial phase of the spatial frequencies comprising the hologram function does not affect the location or intensity of the readout light beam at the photodetective array, and, hence, is of no consequence.

Figure 6:
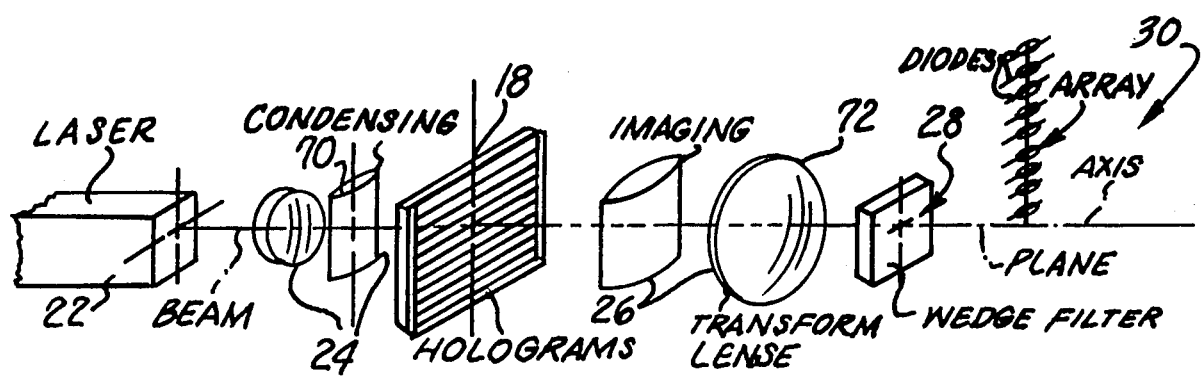
FIG. 6 is a perspective illustration of the optical readout apparatus employed in one embodiment of the invention.

Following the recording of a sequence of holograms, the film is developed and its surface hardened by conventional film processing equipment. The data in the hologram may be readout by equipment as shown with reference to FIGS. 2 and 6. Thus the film 18, containing the recorded hologram function, is positioned so as to be illuminated by a coherent light beam derived from laser source 22. This laser beam is applied through conventional beam shaping optics 24 which may include a condensing lens 70, so that the shape of the beam is such as to illuminate slightly less than all of the recorded hologram in order to leave some margin to prevent illuminating an adjacent hologram area at the same time. It is to be noted that the hologram may be illuminated with a light beam which is perpendicular to the hologram plane, as illustrated in FIG. 6, or may be illuminated by an off axis beam.

After transmission through the beam shaping optics and the hologram recorded on film 18, the beam passes through conventional reconstruction optics 26 and then through a wedge filter 28 before illuminating an array of photosensitive diodes 30. The wedge filter 28 is employed for equalizing the signal energy of each bit in the optical reconstruction incident on the photosensitive detector array. The wedge filter atenuates signal and noise components by the same atenuation ratio, and, hence, does not affect the signal to noise ratio.

The reconstruction optics 26 contains a spherical lens 72 which performs a Fourier transformation on the light beam diffracted by the recorded hologram and focuses the resulting optical bit construction on the photosensitive detector array 30. The Fourier transform of the recorded hologram corresponds to the original data block bit pattern because the transform operation that was performed by the transform generator 12 before recording and the transform operation subsequently performed by lens 72 during readout, are inverse operations.

The photosensitive detectors in the photosensitive array serve to detect the incident optical bit reconstruction light pattern passed by the wedge filter 28 and convert the pattern into an electrical bit stream. The photosensitive array 30 and readout electronics 32 may be conventional in the art and, for example, may include a self-scanning type of array which is well known and commercially available from the Reticon Corporation of Mountain View, California. In this circuit the photosensitive array causes the individual photodetectors of the array to be interrogated one at a time as a traveling pulse arrives at them in succession to produce a serial stream of output data. Upon completion of one scan of all of the photosensitive detectors of the array, another scan is started. In this scanner, the readout electronics 32 provides an output corresponding with the original data provided by the data source 10.

Wedge Filter

Figure 7:
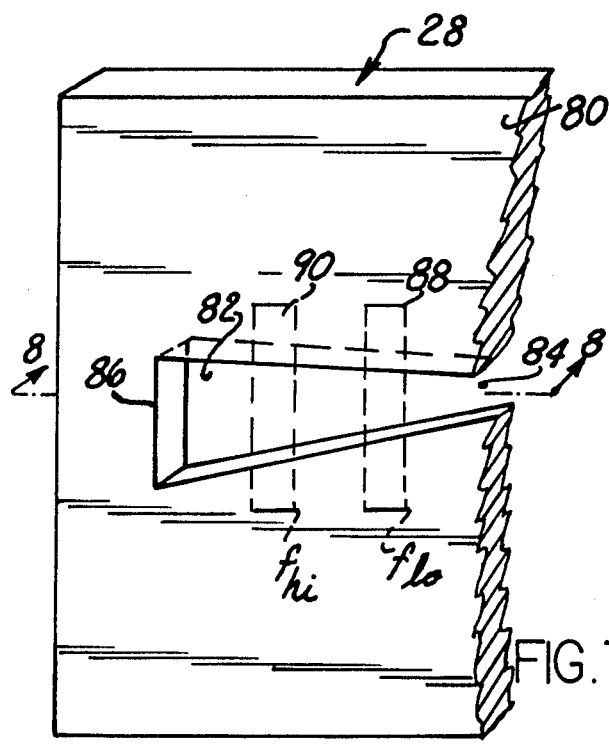
FIG. 7 is a perspective illustration of the construction of a wedge filter employed in one embodiment of the invention.
Figure 8:
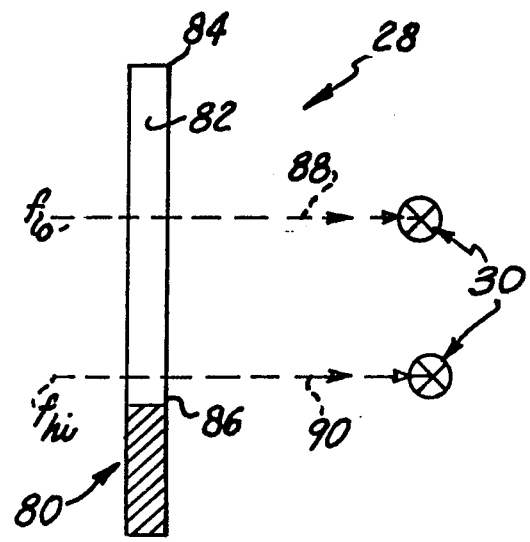
FIG. 8 is a sectional view taken along line 8-8 in FIG. 7 and looking in the direction of the arrows.
Figure 9:
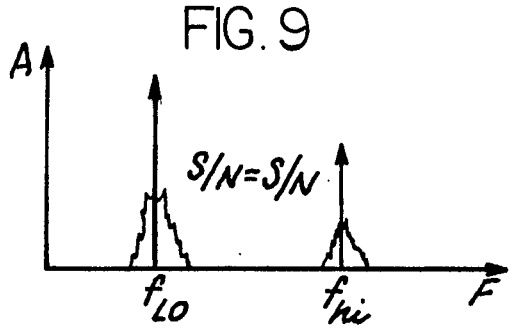
FIG. 9 is a graphical illustration of signal to noise characteristics at low and high frequencies without the use of a wedge filter.
Figure 10:
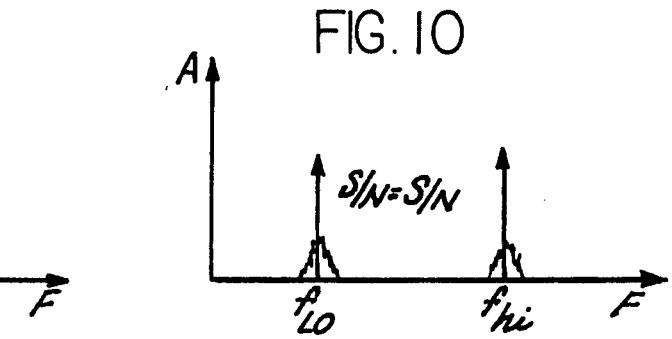
FIG. 10 is a graphical illustration of signal to noise characteristicss at low and high frequencies with the use of a wedge filter.

In accordance with one aspect of the present invention, the readout system employs the wedge filter 28 which is constructed to provide amplitude compensation of the reconstructed data band such that equal energy signals are incident upon each element of the photosensitive array. This may be more readily understood from an examination of FIGS. 7, 8, 9 and 10 in light of the description that follows. The wedge filter 28 may be constructed as illustrated in FIGS. 7 and 8. Basically, the filter takes any convenient form of a nontransparent body 80 which serves to block the passage of light except for that permitted through a wedge shaped aperture 82. Consequently then, the block is positioned so that the aperture 82 is transverse to the direction of propagation of the laser beam passed by the transform lens 72. The narrow end 84 of the aperture is located along the optical axis of the laser beam and the wide end 86 is positioned perpendicularly therefrom and in alignment with the array of photosensitive diodes 30.

The wedge shaped aperture is shaped so that, as seen in FIG. 7, a low frequency light beam 88 has a greater portion of its energy blocked than that of a higher frequency beam 90. In the absence of such filtering the energy provided by light beam 88 would exhibit a greater energy level than that of beam 90 as is indicated by the graphical illustration of FIG. 9. This is because low frequency light beams exhibit higher intensities than that of the higher frequency light beams. To prevent the diodes from misinterpreting the information, the wedge filter passes less of the beam length of the lower frequencies than it does the higher frequencies so that they strike the respective diodes at equal intensities. Moreover, the tapering of the aperture in the wedge filter is such that the signal to noise ratio remains constant for both the high frequency intensity levels as that for the low frequency intensity levels, as is depicted by the graphical waveform of FIG. 10.

Digital Filter

The digital filter 42 serves to compensate for the modulation transfer function in that it compensates for the signal amplitude variations as a function of spatial frequency. As will be recalled with reference to the graphical waveform of FIG. 3, the modulation transfer function is such that the amplitude or intensity as observed upon readout of the hologram functions varies with spatial frequency such that the signal to noise ratio increases with spatial frequency. The digital filter 42 serves to weight the spatial frequencies differently so that over the data band of interest employed the signal to noise ratio remains substantially constant. From an observation of FIG. 3 the compensation may be obtained by increasing the signal levels relative to the noise levels at the low frequencies or by decreasing the signal levels at higher frequencies. In accordance with the present invention, both of these factors are combined so that throughout the spatial frequency spectrum the Fourier coefficients or samples obtained from the Fourier transform generator 12 are compensated by both adding a factor to the signal at the low frequency levels and subtracting a factor from the signals at the high frequency levels. This is done in accordance with the following equation.

$$S_i = W_n - K(W_{n-1} + W_{n+1}) \text{ (Eq. 1)}$$

where:
$S_i$ = the corrected value of the Fourier coefficient
$W_n$ = the uncorrected Fourier coefficient
$W_{n-1}$ = the uncorrected immediately previous coefficient
$W_{n+1}$ = the next succeeding uncorrected coefficient
$n$ = the total number of samples for each hologram function provided by generator 12
$K$ = a constant having a value between zero and unity The digital filter 42 as implemented in the embodiment illustrated in FIG. 11 solves equation 1. For purposes of illustration, the filter operates on the samples obtained from the Fourier transform generator on the basis that each is an eight bit sample. Also, the bit signal flow is in parallel format and is synchronized by clock pulses from a clock source $\phi_c$. The filter employs three registers 100, 102, 104 together with two adders each of which is constructed in a manner well known in the art. On each clock pulse the sample word present at the input to the A register 100 is loaded into the register and appears at the output thereof. However, this digital word is not loaded into the succeeding B register 102 until the next clock cycle. Instead, the previous word existing in the A register 100 is shifted and loaded into the B register. The A adder and B adder are not clocked and consequently whatever sample word is present at the output of the B register is added to whatever sample word appears at the input to the A register (but not yet loaded into the A register) and appears at the output of adder 106. The binary summation word provided at the output of the A adder 106 is not loaded into the C register 104 until the next clock pulse. The B adder receives the sample word located at the output of the B register 102 and it is this sample word that is being compensated by the filter. The compensation requires the solution to equation 1, and, hence, the B adder subtracts from the present sample word on the output of the B register a value corresponding with a constant multiplied by the word provided at the output of the C register.

In the example being presented the value of the constant K is set at 0.5. In an eight bit parallel transfer system as disclosed this may be accomplished by grounding the bit $b_1$ output of register 104 and the bit $b_8$ input of the B adder and then shifting each bit one position as by connecting the bit $b_2$ output of the C register to the bit $b_1$ input of the B adder and so on. Since the output of the C register is to be subtracted from the B adder each bit line extending from the C register to the B adder is provided with a signal inverter, inverters 110 and 112 being illustrated in FIG. 11 with respect to the bit $b_2$ and bit $b_8$ outputs of the C register.

Figure 11:
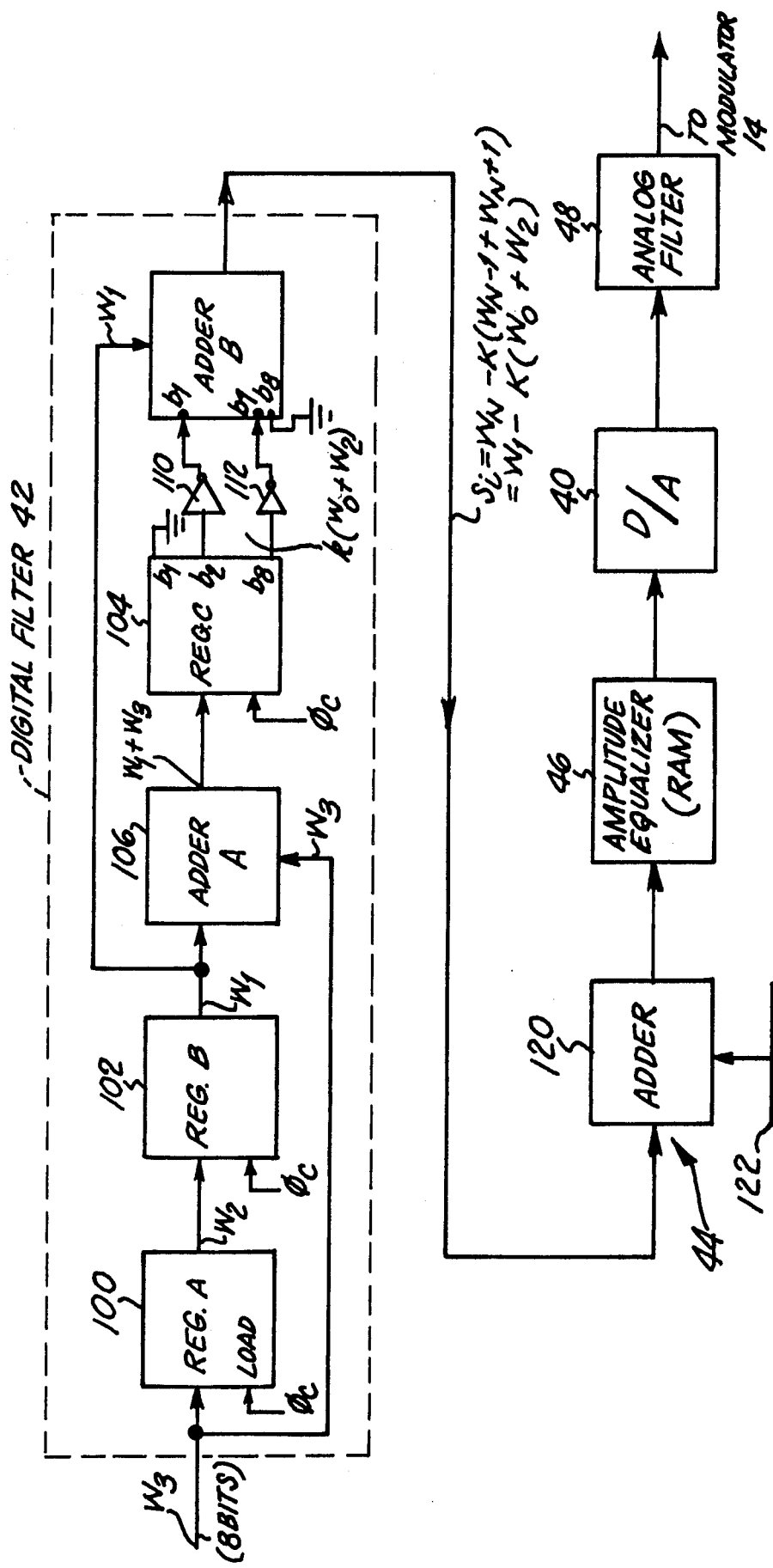
FIG. 11 is a combined block diagram-schematic circuit illustration of a digital filter employed in one embodiment of the invention.

The operation of the digital filter may be better understood from FIG. 11 with the following example. Assume for the moment that we are at a rest condition, between clock pulses and that the input sample word to the A register is word $W_3$ and the previous sample word is $W_2$ and this is presently stored in the A register and appears at its output circuit. The word previously to word $W_2$ may be referred to as word $W_1$ and this is present in the B register and is provided at its output circuit. Consequently, the A adder provides at its output the addition of words $W_1$ plus $W_3$. This, however, has not yet been loaded into the C register 104. Instead the C register 104 presently stores the previous summation word $W_0$ plus $W_2$. It is this sample word which has been multiplied by a factor of K and supplied to the B adder. Consequently at this point in time the output from the B adder is a compensated sample word $W_1 -$ K ($W_0 + W_2$). It is seen then that after the next clock cycle the output from the B adder will be $W_2 -$ K ($W_1 + W_2$) and so on.

Bias Adder

As discussed hereinbefore with reference to FIG. 1, it is contemplated that the signal conditioner SC employ a bias addition circuit 44 because it is further contemplated that the Fourier transform generator word samples may have both positive and negative values. In order to prevent the beam modulating function from becoming negative at any time the output of the digital filter is offset by a fixed bias signal. This may be attained in various ways. In the embodiment illustrated, this is attained by circuit 44 and which includes a multibit adder 120 which serves to receive each of the compensated sample words from the filter 42 and adds to it a fixed bias from a suitable digital bias source 122. Thus, modified compensated sample words are applied to the amplitude equalizer 46.

Amplitude Equalizer

As discussed hereinbefore with reference to the graphical illustration of FIG. 4 the amplitude equalizer serves to weight the hologram function nonlinearly so as to compensate for system nonlinearities of amplitude that arise in the recording process and the film amplitude response characteristics. In the graphical illustration of FIG. 4 the nonlinear response characteristics are reperesented by curve 62 and consequently each sample provided by the Fourier transform generator requires amplitude compensation. This was demonstrated by the example hereinbefore wherein the sample $S_1$ required a correction of $\Delta I_1$ so that the proper intensity level $I_1$, in accordance with the linear curve 60, is obtained. Preferably, the amplitude equalizer is implemented in conjunction with the digital filter 42 by employing a random access memory (RAM) which has been programmed or tailored in accordance with the response characteristics demonstrated in FIG. 4 so that as each word sample is provided by adder 120 a compensation for that particular word sample is made. In this manner, the compensated word sample from the digital filter, as modified by the bias adder 44, is then amplitude equalized in a nonlinear fashion by the equalizer 46 with the resultant binary word being then converted into an analog signal by the digital to analog converter 40. The result then is a time varying analog signal representative of the Fourier transform of the original byte of data which, after filtering by the analog filter 48, is supplied to the modulator 14 to intensity modulate a coherent light beam in the hologram recording process.

ALTERNATIVE EMBODIMENTS

Figure 12:
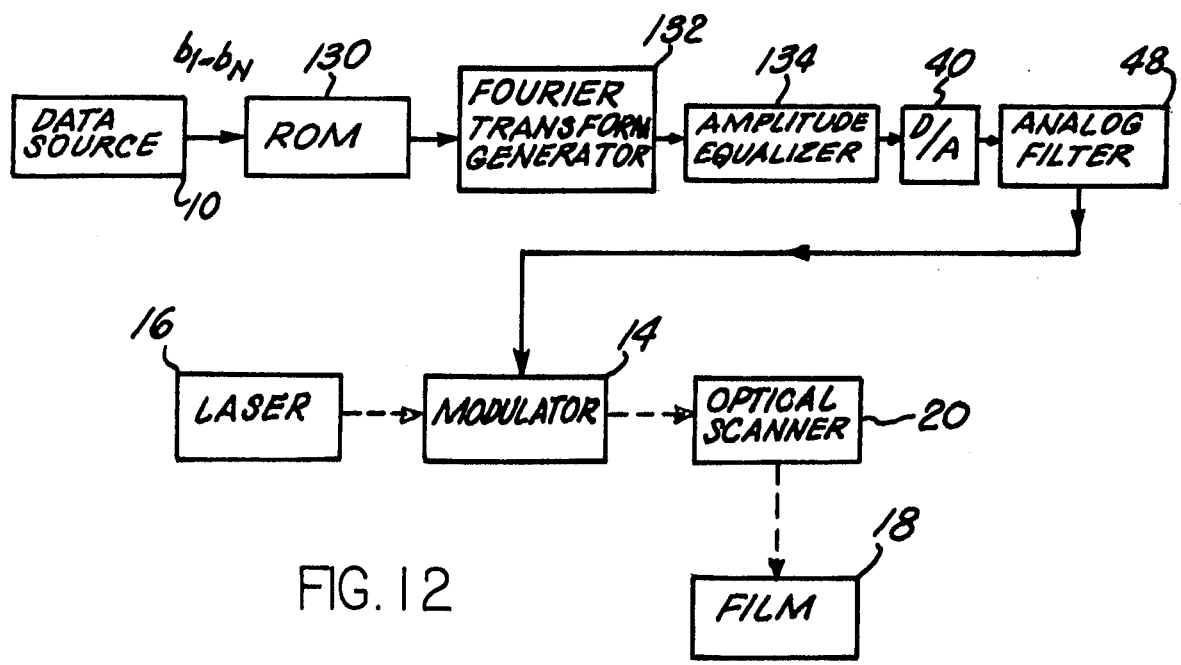
FIG. 12 is a block diagram illustration of a synethic hologram recording system in accordance with a second embodiment of the invention; and, FIG. 13 is a block diagram illustration of a synthetic hologram recording system in accordance with a third embodiment of the invention.

Reference is now made to FIG. 12 which illustrates an alternative embodiment of the recording equipment in accordance with the present invention and which is constructed along lines similar to that illustrated in FIG. 1. In order to simplify the description herein for one skilled in the art like components in FIGS. 1 and 12 are identified with like character references with only the differences in the two embodiments being described in detail. The embodiment of the invention in FIG. 12 like that of FIG. 1 contemplates a digital system wherein an analog filter 48 provides a time varying signal to a modulator 14 to intensity modulate a coherent light beam obtained from a laser source 16. The modulating signal is then scanned across a photosensitive film 18 by means of a rotating optical scanner 20. The embodiment of FIG. 12 also contemplates that a data source 10 provide a byte of binary data including bits $b_1$ through $b_n$. However, this embodiment does not employ the digital filter 42 of embodiment in FIG. 1. Instead, signal weighting is accomplished with a read only memory 130 before the byte of data is transformed by the Fourier transform generator. In this way, each data bit is amplitude weighted in accordance with a look up table compensation provided by the ROM 130 which is programmed so as to achieve substantially constant signal to noise ratio as a function of spatial frequency. Consequently then, the weighted bits are supplied by ROM 130 to a Fourier transform generator 132, which may be constructed in the same manner as generator 12, and which provides Fourier transform samples. These samples are then equalized, as with an amplitude equalizer 134 which may be constructed as discussed hereinbefore with reference to equalizer 46. The output of the amplitude equalizer is then applied through a digital to analog converter 40 with the time varying analog signal being filtered by the filter 48 before being applied to the modulator 14.

Figure 13:
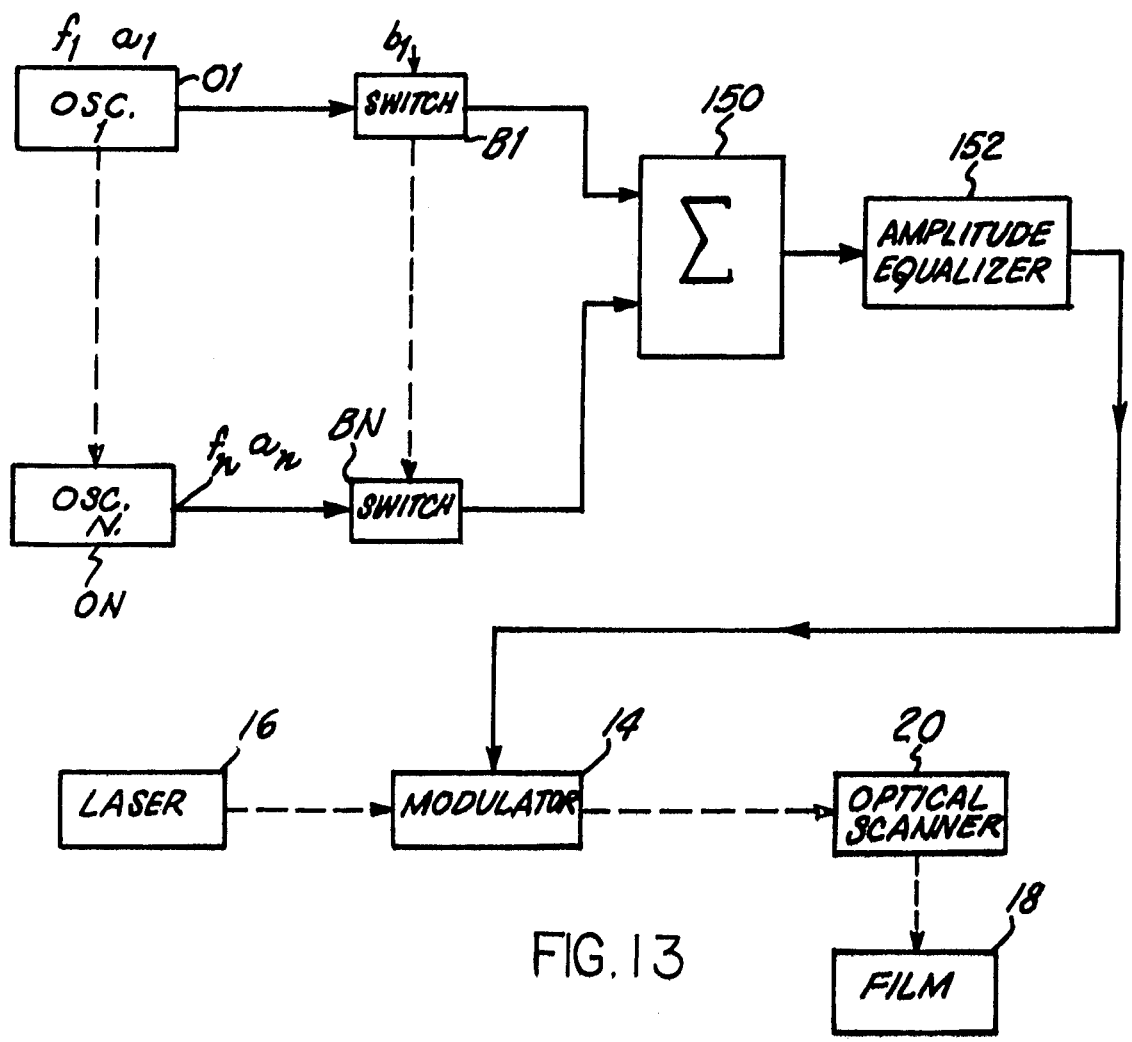

The embodiment illustrated in FIG. 13 may be termed an analog embodiment of the invention in that it employs a plurality of oscillators 01 through ON each of which is adjustable as to frequency and amplitude. The number of oscillators employed depends on the number of bits in the input byte of data. If a bit is present, meaning that it has a particular binary level such as "1" then that frequency will be present in the transform among the various spatial frequencies. In the analog embodiment, this may be implemented by applying each bit of the byte to an associated bit switch B1 through BN. If a bit, meaning a binary "1", is present in the associate bit position in the byte of data then the switch will be actuated to pass the associated frequency from one of the oscillators O1 through ON. For example, if the first bit position is occupied by a binary "1" signal, then bit $b_1$, will have a binary "1" level and will actuate the bit switch B1 to pass the frequency signal provided by oscillator 01. The amplitudes $a_1$ through $a_n$ are adjusted in accordance with the spatial frequency to provide a substantially uniform signal to noise ratio over the spatial frequency spectrum containing data information. The frequencies which are passed by the bit switches B1 through BN are summed in an analog summation circuit 150 so that a composite waveform of the various frequencies of their respective amplitudes is supplied to an analog amplitude equalizer 152 which provides compensation for amplitude nonlinearities in the recording process and in the filming amplitude response. This is achieved by making the amplitude equalizer a nonlinear gain amplifier to provide the amplitude equalization. The time varying analog output signal taken from the equalizer 152 is applied, as in the emodiments in FIG. 1 and 12, to a modulator 14 so as to intensity modulate a coherent light beam from laser source 16.

From the foregoing it is seen that in the various embodiments of the invention there is provided a time varying control signal which serves to amplitude modulate a coherent light beam as it is being scanned across a recording film to record a synthetic hologram. The time varying control signal is obtained, as from a Fourier transform generator of the digital or analog variety, and takes the form of an output signal which contains information representative of the summation of a plurality of frequencies with each frequency being representative of the presence of a bit at a particular bit position in the byte of binary data to be recorded. Also, in each embodiment this information containing output signal is utilized to provide the modulating control signal such that the control signal is compensated for noise characteristics either in the total system or in a subsystem portion. In the embodiments of FIGS. 12 and 13 a discrete digital filter is not employed. Instead, the analog version of FIG. 13 provides the function of the discrete filter by weighting the amplitudes of the various frequencies provided by oscillators 01 through ON. In the embodiments of FIG. 12, the read only memory 130 provides the weighting. In all three of these embodiments, care is taken to provide essentially uniform signal to noise ratio as a function of spatial frequency. Each embodiment also employs an amplitude equalizer to provide weighting to compensate for the nonlinear amplitude characteristics of the recording system and the response characteristics of the recording film.

The Fourier transform generator 12 may take the form as illustrated and described in copending United States patent application Ser. No. 665,709 filed on Mar. 10, 1976 in the name of Knox Gillis and entitled IMPROVED FOURIER TRANSFORM GENERATOR (attorney's docket — EO-6624) and which application is assigned to the same assignee as the instant application.

Whereas the invention has been described in conjunction with preferred embodiments it is to be appreciated that various modifications may be made without departing from the spirit and the scope of the present invention as defined by the appended claims.

What is claimed is:

1. Apparatus for recording a Fourier transform hologram of a multibit byte of binary data comprising:
   means for providing a time varying analog electrical signal representative of a Fourier transform of a multibit byte of binary data,
   photosensitive recording means capable of recording an intensity modulated pattern of coherent light and having a nonlinear transmittance versus exposure characteristic;
   means for providing a beam of coherent light;
   means for scanning said beam transversely of its direction of propagation across said recording means;
   means responsive to said analog electrical signal for intensity modulating said beam as it is scanned across said recording means so as to thereby record a Fourier transform hologram of said byte of data;
   said analog electrical signal providing means including compensating means for causing nonlinear variations in the magnitude of said analog electrical signal affecting the intensity modulation of said coherent light to compensate for nonlinear response characteristics of said modulating means to said analog electrical signal and for said nonlinear characteristic of said recording means whereby the transmittance of said recording means linearly corresponds to the value of said analog electrical signal.

2. Apparatus as set forth in claim 1, wherein said analog signal providing means includes means for providing a plurality of digital sample signals representative of samples of said Fourier transform, and said compensating means includes means responsive to each said digital sample signal for providing an associated compensated digital sample signal which includes compensation for said non-linear variations.

3. Apparatus as set forth in claim 2, wherein said analog signal providing means further includes conversion means for converting said compensated digital sample signals into said time varying analog signal.

4. Apparatus as set forth in claim 2 wherein said analog signal providing means further includes means for causing variations in the values of said digital sample signals to compensate for signal-to-noise variations of a subsequent readout of said recording means.

5. Apparatus as set forth in claim 1 and further comprising means for reading the pattern recorded on said recording means.

6. Apparatus for recording a Fourier transform hologram of a multibit byte of binary data comprising:

means for providing a time varying analog signal representative of a Fourier transform of a multibit byte of binary data, said analog signal providing means including means for providing a plurality of digital sample signals representative of samples of said Fourier transform, and conversion means for converting said compensated digital sample signals into said time varying analog signal;

photosensitive recording means capable of recording an intensity modulated pattern of coherent light and having a nonlinear transmittance versus exposure characteristics;

means for providing a beam of coherent light;

means for scanning said beam transversely of its direction of propagation across said recording means;

means responsive to said analog signal for intensity modulating said beam as it is scanned across said recording means so as to thereby record a Fourier transform hologram of said byte of data;

said analog signal providing means including compensating means for causing nonlinear variations in the magnitude of said analog signal affecting the intensity modulation of said coherent light to compensate for nonlinear response characteristics of said modulating means to said analog signal and for said nonlinear characteristic of said recording means whereby the transmittance of said recording means linearly corresponds to the value of said analog signal, said compensating means including means responsive to each said digital sample signal for providing an associated compensated digital sample signal which includes compensation for said non-linear variations, said means responsive to each said digital sample signal comprising programmed memory means for storing a said compensated digital sample signal for each said digital sample signal.

7. Apparatus for recording a Fourier transform hologram of a multibit byte of binary data comprising:

means for providing a time varying analog signal representative of a Fourier transform of a multibit byte of binary data, said analog signal providing means including means for providing a plurality of digital sample signals representative of samples of said Fourier transform;

photosensitive recording means capable of recording an intensity modulated pattern of coherent light and having a nonlinear transmittance versus exposure characteristic;

means for providing a beam of coherent light;

means for scanning said beam transversely of its direction of propagation across said recording means;

means responsive to said analog signal for intensity modulating said beam as it is scanned across said recording means so as to thereby record a Fourier transform hologram of said byte of data;

said analog signal providing means including compensating means for causing nonlinear variations in the magnitude of said analog signal affecting the intensity modulation of said coherent light to compensate for nonlinear response characteristics of said modulating means to said analog signal and for said nonlinear characteristic of said recording means whereby the transmittance of said recording means linearly corresponds to the value of said analog signal, said compensating means including means responsive to each said digital sample signal for providing an associated compensated digital sample signal which includes compensation for said non-linear variations; and, wherein said analog signal contains information representative of a summation of a plurality of discrete frequencies with each frequency being indicative of the presence of a data bit of a given binary level at a particular bit position in said byte of binary data, said analog signal providing means including digital compensating means for causing variations in the values of said digital sample signals to compensate for signal-to-noise variations as a function of said frequencies.

8. Apparatus as set forth in claim 7, wherein said analog signal providing means includes means for sequentialy providing a plurality of uncompensated digital sample signals representative of samples of said Fourier transform, said digital compensating means including means responsive to each said uncompensated digital sample signal for providing an associated said digital sample signal having a value which includes compensation for variations in the signal-to-noise ratio with variations in frequency so that the signal-to-noise ratio is maintained essentially constant with frequency.

9. Apparatus as set forth in claim 8, wherein said digital compensating means includes means for varying the value of each said uncompensated digital sample signal by an amount which varies in accordance with the respective values of a given preceeding and a given succeeding uncompensated digital sample signal.

10. Apparatus for recording and reading a Fourier transform hologram of a multibit byte of binary data comprising:

means for providing a time varying analog signal representative of a Fourier transform of a multibit byte of binary data;

photosensitive recording means capable of recording an intensity modulated pattern of coherent light and having a nonlinear transmittance versus exposure characteristic;

means for providing a beam of coherent light;

means for scanning said beam transversely of its direction pf propagation across said recording means;

means responsive to said analog signal for intensity modulating said beam as it is scanned across said recording means so as to thereby record a Fourier transform hologram of said byte of data;

said analog signal providing means including compensating means for causing nonlinear variations in the magnitude of said analog signal affecting the intensity modulation of said coherent light to compensate for nonlinear response characteristics of said modulating means to said analog signal and for said nonlinear characteristic of said recording means whereby the transmittance of said recording means linearly corresponds to the value of said analog signal; and, means for reading the pattern recorded on said recording means;

wherein said analog signal contains information representative of a summation of a plurality of discrete frequencies with each frequency being indicative of the presence of a data bit of a given binary level at a particular bit position in said byte of binary data, and wherein said reading means includes means for transmitting a beam of coherent light along an optical axis through said recording means such that light portions are spatially diffracted in accordance with said plurality of discrete frequencies and distributed perpendicularly of the optical axis as a function of increasing frequency, said spatially diffracted light portions varying in intensity inversely with the distance from said optical axis.

11. Apparatus as set forth in claim 10 wherein said reading means further comprises means for optically attenuating said light portions differently in accordance with the transverse distance of said portions from said optical axis so as to make the intensities of said various portions more nearly equal.

12. Apparatus as set forth in claim 11 wherein said attenuating means comprises spatial filter means for confining the spatial extent of said light portions differently in accordance with the transverse distance of said portions from said optical axis.

13. Apparatus as set forth in claim 11, wherein said attenuating means comprises a wedge filter.

14. A method of recording a Fourier transform hologram of a byte of binary data comprising the steps of:
generating a time varying analog electrical signal representing a Fourier transform of a byte of binary data; and,
intensity modulating a beam of coherent light in accordance with said analog electrical signal as said beam scan across a photosensitive recording means so as to record a Fourier transform hologram of said byte of binary data;
said step of generating said analog electrical signal including the step of varying the value of said analog electrical signal so as to affect the intensity modulation of said coherent light to compensate at least for non-linearities in said intensity modulating step and for non-linear response characteristics of said recording means whereby the record thus recorded on said photosensitive recording means linearly corresponds to the value of said analog electrical signal prior to compensation.

15. A method as set forth in claim 14, wherein said step of generating said analog electrical signal further comprises the steps of sequentially providing a plurality of digital signals respectively representative of different samples of said Fourier transform and said step of varying the value of said analog electrical signal includes the steps of modifying the value of each said digital signal and converting the modified digital signals into said time varying analog electrical signal.

16. A method as set forth in claim 15 wherein the step of providing said plurality of digital signals includes the step of varying the value of each said digital signal to compensate for signal-to-noise variations of a subsequent readout of said recording means.

17. Apparatus for recording a Fourier transform hologram of a multibit byte of binary data comprising:
means for providing a time varying analog electrical signal representative of a Fourier transform of a multibit byte of binary data,
photosensitive recording means capable of recording an intensity modulated pattern of coherent light;
means for providing a beam of coherent light;
means for scanning said beam tranversely of its direction of propagation across said recording means;
means responsive to said analog electrical signal for intensity modulating said beam as it is scanned across said recording means so as to thereby record a Fourier transform hologram of said byte of data;
said analog electrical signal providing means including compensating means for altering the frequency versus amplitude characteristic of said analog signal so as to compensate for signal-to-noise variations of a subsequent read-out of said recording means.

18. Apparatus as set forth in claim 17, wherein said analog electrical signal providing means includes means for sequentially providing a plurality of uncompensated digital sample signals representative of samples of said Fourier transform, said compensating means being responsive to each said uncompensated digital sample signal for providing an associated digital sample signal having a value which includes compensation for variations in the signal-to-noise ratio with variations in frequency so that the signal-to-noise ratio is maintained essentially constant with frequency, said compensating means including means for varying the value of each said uncompensated digital sample signal by an amount which varies in accordance with the respective values of a given preceeding and a given succeeding uncompensated digital sample signal.

* * * * *